US011308984B2

United States Patent
Herdendorf et al.

(10) Patent No.: US 11,308,984 B2
(45) Date of Patent: Apr. 19, 2022

(54) RETRACTABLE RAMP FOR DATA STORAGE DEVICES

(71) Applicant: Seagate Technology LLC, Fremont, CA (US)

(72) Inventors: Brett R. Herdendorf, Mound, MN (US); Riyan Alex Mendonsa, Edina, MN (US); Krishnan Subramanian, Shakopee, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 16/910,593

(22) Filed: Jun. 24, 2020

(65) Prior Publication Data
US 2021/0407538 A1 Dec. 30, 2021

(51) Int. Cl.
*G11B 5/54* (2006.01)
*G11B 21/22* (2006.01)
*G11B 17/02* (2006.01)
*G11B 21/12* (2006.01)
G11B 5/596 (2006.01)
H05K 5/02 (2006.01)
G11B 33/12 (2006.01)
G11B 5/48 (2006.01)

(52) U.S. Cl.
CPC ............ *G11B 5/54* (2013.01); *G11B 17/021* (2013.01); *G11B 21/12* (2013.01); *G11B 21/22* (2013.01); G11B 5/4806 (2013.01); G11B 5/596 (2013.01); G11B 33/125 (2013.01); H05K 5/0221 (2013.01)

(58) Field of Classification Search
None
See application file for complete search history.

(56) References Cited

U.S. PATENT DOCUMENTS

| | | |
|---|---|---|
| 3,311,902 A | 3/1967 | Appleton |
| 3,940,794 A | 2/1976 | Griffiths et al. |
| 4,164,767 A | 8/1979 | Gyi et al. |
| 4,208,685 A | 6/1980 | Matla et al. |
| 4,566,087 A | 1/1986 | Kraft |
| 4,742,410 A | 5/1988 | Smith |

(Continued)

FOREIGN PATENT DOCUMENTS

WO 2020018854 A1 1/2020

OTHER PUBLICATIONS

Non-Final Rejection for U.S. Appl. No. 16/805,174, dated Sep. 25, 2020, 7 pages.

(Continued)

*Primary Examiner* — Craig A. Renner
(74) *Attorney, Agent, or Firm* — Westman, Champlin & Koehler, P.A.

(57) ABSTRACT

A data storage device includes a ramp that supports at least one head, and a retraction mechanism that moves the ramp from a non-retracted position to a retracted position. The movement of the ramp is enabled by at least one of expansion or contraction of at least a portion of the retraction mechanism. The data storage device further includes a ramp retraction control module operably coupled to the retraction mechanism. The ramp retraction control module provides the retraction mechanism with a first control signal that causes the retraction mechanism to move the ramp from the non-retracted position to the retracted position.

21 Claims, 11 Drawing Sheets

(56) References Cited

U.S. PATENT DOCUMENTS

| | | |
|---|---|---|
| 4,839,756 A | 6/1989 | Chew et al. |
| 4,884,261 A | 11/1989 | Dalziel |
| 4,888,751 A | 12/1989 | Yoshimaru et al. |
| 5,023,737 A | 6/1991 | Yaeger |
| 5,283,705 A | 2/1994 | Iwabunchi |
| 5,293,282 A | 3/1994 | Squires et al. |
| 5,307,224 A | 4/1994 | Minase |
| 5,341,260 A | 8/1994 | Jabbari |
| 5,343,347 A | 8/1994 | Gilovich |
| 5,347,414 A | 9/1994 | Kano |
| 5,459,921 A | 10/1995 | Hudson et al. |
| 5,467,238 A | 11/1995 | Lee et al. |
| 5,550,695 A | 8/1996 | Matsumoto |
| 5,764,437 A | 6/1998 | Meyer et al. |
| 5,831,795 A | 11/1998 | Ma et al. |
| 5,973,886 A | 10/1999 | Khuu |
| 5,973,887 A | 10/1999 | Cameron |
| 5,995,332 A | 11/1999 | Patterson |
| 5,999,351 A | 12/1999 | Albrecht et al. |
| 6,005,747 A | 12/1999 | Gilovich |
| 6,055,134 A | 4/2000 | Boutaghou |
| 6,067,208 A | 5/2000 | Segar |
| 6,081,399 A | 6/2000 | Lee et al. |
| 6,091,576 A | 7/2000 | Eckerd et al. |
| 6,115,214 A | 9/2000 | Allsup et al. |
| 6,122,130 A | 9/2000 | Boutaghou et al. |
| 6,134,076 A | 10/2000 | Boutaghou et al. |
| 6,157,520 A | 12/2000 | Mangold et al. |
| 6,160,686 A | 12/2000 | Albrecht et al. |
| 6,201,666 B1 | 3/2001 | Resh |
| 6,275,356 B1 | 8/2001 | Boutaghou et al. |
| 6,278,584 B1 | 8/2001 | Zhang et al. |
| 6,344,950 B1 | 2/2002 | Watson et al. |
| 6,404,580 B1 | 6/2002 | Fioravanti |
| 6,449,129 B1 | 9/2002 | Macpherson et al. |
| 6,452,753 B1 | 9/2002 | Hiller et al. |
| 6,473,268 B2 | 10/2002 | Simozato |
| 6,473,270 B1 | 10/2002 | McDonald et al. |
| 6,480,361 B1 | 11/2002 | Patterson |
| 6,487,050 B1 | 11/2002 | Liu |
| 6,490,135 B1 | 12/2002 | Sannino et al. |
| 6,507,460 B2 | 1/2003 | Fayeulle et al. |
| 6,519,115 B1 | 2/2003 | Yaeger |
| 6,577,473 B1 | 6/2003 | Macpherson et al. |
| 6,597,540 B2 | 7/2003 | Tsuda et al. |
| 6,621,651 B1 | 9/2003 | Ratliff et al. |
| 6,650,506 B1 | 11/2003 | Risse |
| 6,693,773 B1 | 2/2004 | Sassine |
| 6,710,964 B1 | 3/2004 | Rao et al. |
| 6,775,107 B2 | 8/2004 | Kasajima et al. |
| 6,847,504 B1 | 1/2005 | Bennett et al. |
| 6,855,282 B2 | 2/2005 | Fayeulle et al. |
| 6,952,319 B2 | 10/2005 | Weiehelt et al. |
| 6,989,965 B2 | 1/2006 | Mundt et al. |
| 7,102,842 B1 | 9/2006 | Howard |
| 7,385,781 B1 | 6/2008 | Craig et al. |
| 7,548,399 B2 | 6/2009 | Shin |
| 7,672,083 B1 | 3/2010 | Yu et al. |
| 7,675,712 B2 | 3/2010 | Liu et al. |
| 7,733,610 B2 | 6/2010 | Scura et al. |
| 7,813,078 B1 | 10/2010 | Gleason et al. |
| 7,848,057 B1 | 12/2010 | Shukla |
| 7,986,491 B2 | 7/2011 | Albrecht et al. |
| 8,024,853 B2 | 9/2011 | Rivera |
| 8,035,913 B2 | 10/2011 | Kim et al. |
| 8,112,580 B2 | 2/2012 | Bandic et al. |
| 8,194,345 B2 | 6/2012 | Kwon et al. |
| 8,208,215 B2 | 6/2012 | Molaro et al. |
| 8,493,690 B1 | 7/2013 | Ono et al. |
| 8,824,094 B1 | 9/2014 | Furlong et al. |
| 8,873,200 B2 | 10/2014 | Warn et al. |
| 8,958,172 B1 | 2/2015 | Hansen |
| 8,958,173 B1 | 2/2015 | Hirano et al. |
| 9,025,277 B1 | 5/2015 | Hirano |
| 9,171,560 B1 | 10/2015 | Davidson et al. |
| 9,183,862 B1 | 11/2015 | Shah et al. |
| 9,218,833 B1 | 12/2015 | Shah et al. |
| 9,449,649 B1 | 9/2016 | Rejae et al. |
| 9,536,552 B1 | 1/2017 | Chen et al. |
| 9,552,835 B1 | 1/2017 | Tamayo et al. |
| 9,704,521 B1 | 7/2017 | Shah et al. |
| 10,269,380 B1 | 4/2019 | Sun et al. |
| 10,622,012 B1 | 4/2020 | Tu et al. |
| 10,803,891 B1 | 10/2020 | Jacoby et al. |
| 2001/0033459 A1 | 10/2001 | Boutaghou |
| 2005/0280945 A1 | 12/2005 | Duvall et al. |
| 2005/0286171 A1 | 12/2005 | Kim et al. |
| 2006/0002028 A1 | 1/2006 | Nayar et al. |
| 2006/0117558 A1 | 6/2006 | Koh et al. |
| 2006/0171078 A1 | 8/2006 | Kajitani |
| 2006/0256478 A1 | 11/2006 | Hayakawa |
| 2007/0008653 A1* | 1/2007 | Ohno et al. ............... G11B 5/54 360/254.3 |
| 2007/0139810 A1* | 6/2007 | Kim et al. ............. G11B 21/22 360/75 |
| 2008/0055773 A1* | 3/2008 | Nigam .................... G11B 5/54 360/99.01 |
| 2009/0279199 A1 | 11/2009 | Zhang |
| 2010/0091408 A1 | 4/2010 | Albrecht et al. |
| 2010/0246053 A1 | 9/2010 | Satou |
| 2010/0271733 A1* | 10/2010 | Kim ........................ G11B 5/54 360/236.6 |
| 2011/0038074 A1 | 2/2011 | Viskochil et al. |
| 2012/0002328 A1 | 1/2012 | Aoki et al. |
| 2012/0075750 A1 | 3/2012 | Chan et al. |
| 2014/0126084 A1 | 5/2014 | Nakamiya et al. |
| 2019/0333533 A1 | 10/2019 | Mendonsa et al. |
| 2020/0027477 A1 | 1/2020 | Garbarino |
| 2020/0027480 A1 | 1/2020 | Myers et al. |

OTHER PUBLICATIONS

Restriction Requirement for U.S. Appl. No. 15/946,859, dated May 19, 2020, 8 pages.
Final Office Action for U.S. Appl. No. 15/965,097, dated Mar. 11, 2020, 8 pages.
Notice of Allowance for U.S. Appl. No. 15/965,097, dated May 20, 2020, 6 pages.
Non-Final Office Action for U.S. Appl. No. 15/965,097, dated Jul. 13, 2020, 6 pages.
Application and Drawings for U.S. Appl. No. 16/805,174, dated Feb. 28, 2020, 40 pages.
Non-Final Office Action for U.S. Appl. No. 15/965,097, dated Nov. 21, 2019, 7 pages.
Non-Final Office Action for U.S. Appl. No. 15/965,097, dated Apr. 12, 2019, 7 pages.
Notice of Allowance (PTOL-85) for U.S. Appl. No. 15/965,097, dated Sep. 22, 2020, 6 pages.
Prior Art Database Technical Disclosure, IP.com No. IPCOM000228512D, "Retracting Load/Unload Ramp", https://ip.com/IPCOM/000228512, dated Jun. 14, 2013, 6 pages.
Maplesoft Application Brief, "Optimal Control Design of a Voice Coil Head Actuator in a Hard Drive", www.maplesoft.com/appsbriefs, dated 2008, 30 pages.
World's first commercial Hard Drive—IBM 350 (RAMAC); https://www.youtube.com/watch?v=aTkL4FQL2FI; Nov. 27, 2016; 5 pages.
U.S. Appl. No. 16/863,287, filed Apr. 30, 2020, 22 pages.
Non-Final Rejection for U.S. Appl. No. 16/863,287, dated Dec. 23, 2020, 8 pages.
Notice of Allowance and Fee(s) Due for U.S. Appl. No. 16/805,174, dated Jan. 11, 2021, 6 pages.

* cited by examiner

RETRACTABLE RAMP FOR DATA STORAGE DEVICES

SUMMARY

In one embodiment, a data storage device is provided. The data storage device includes a ramp configured to support at least one head in the data storage device, and a retraction mechanism coupled to the ramp and configured to move the ramp from a non-retracted position to a retracted position by at least one of expansion or contraction of at least a portion of the retraction mechanism. The data storage device further includes a ramp retraction control module operably coupled to the retraction mechanism. The ramp retraction control module is configured to provide the retraction mechanism with a first control signal that causes the retraction mechanism to move the ramp from the non-retracted position to the retracted position.

In another embodiment, a method of operating a ramp that is configured to support a head in a data storage device is provided. The method includes moving the ramp from a non-retracted position to a retracted position. The method also includes selectively releasing the ramp from the retracted position at different speeds corresponding to different operating conditions in the data storage device.

In yet another embodiment, a data storage system in provided. The data storage system includes a ramp configured to support at least one head in the data storage system. The ramp has a non-retracted position and a retracted position in the data storage system. The data storage system also includes a ramp retraction control module coupled to the ramp and configured to selectively release the ramp from the retracted position at different speeds corresponding to different operating conditions in the data storage system.

Other features and benefits that characterize embodiments of the disclosure will be apparent upon reading the following detailed description and review of the associated drawings.

DETAILED DESCRIPTION OF ILLUSTRATIVE EMBODIMENTS

Embodiments of the disclosure relate to a retractable head-support ramp for use in a data storage device (e.g., a hard disc drive (HDD)).

In general, in order to keep read/write heads from landing on one or more discs in the HDD when, for example, power is removed from the HDD, and to prevent the heads from colliding with outer edges of the discs during load and unload operations, a head-support ramp is provided adjacent to an outer diameter (OD) of the disc or discs. In a traditional HDD, the ramp is placed over portions of the disc surfaces near the OD such that the heads can easily move on and off the discs straight from/onto the ramp. Such ramps, which remain stationary during HDD operation in traditional HDDs, take space on the discs and reduce the area for recording, thereby leading to loss of storage capacity per HDD, about 5% loss in capacity in some cases.

To address this above-noted problem, embodiments of the disclosure employ a retractable ramp that moves completely off the disc(s), or nearly off the disc(s), when the OD area is to be accessed, thereby enabling data recording to be carried out on substantially entire surfaces of the disc(s). Details regarding the different embodiments are provided below in connection with FIGS. 1A-6.

Figure 1A:
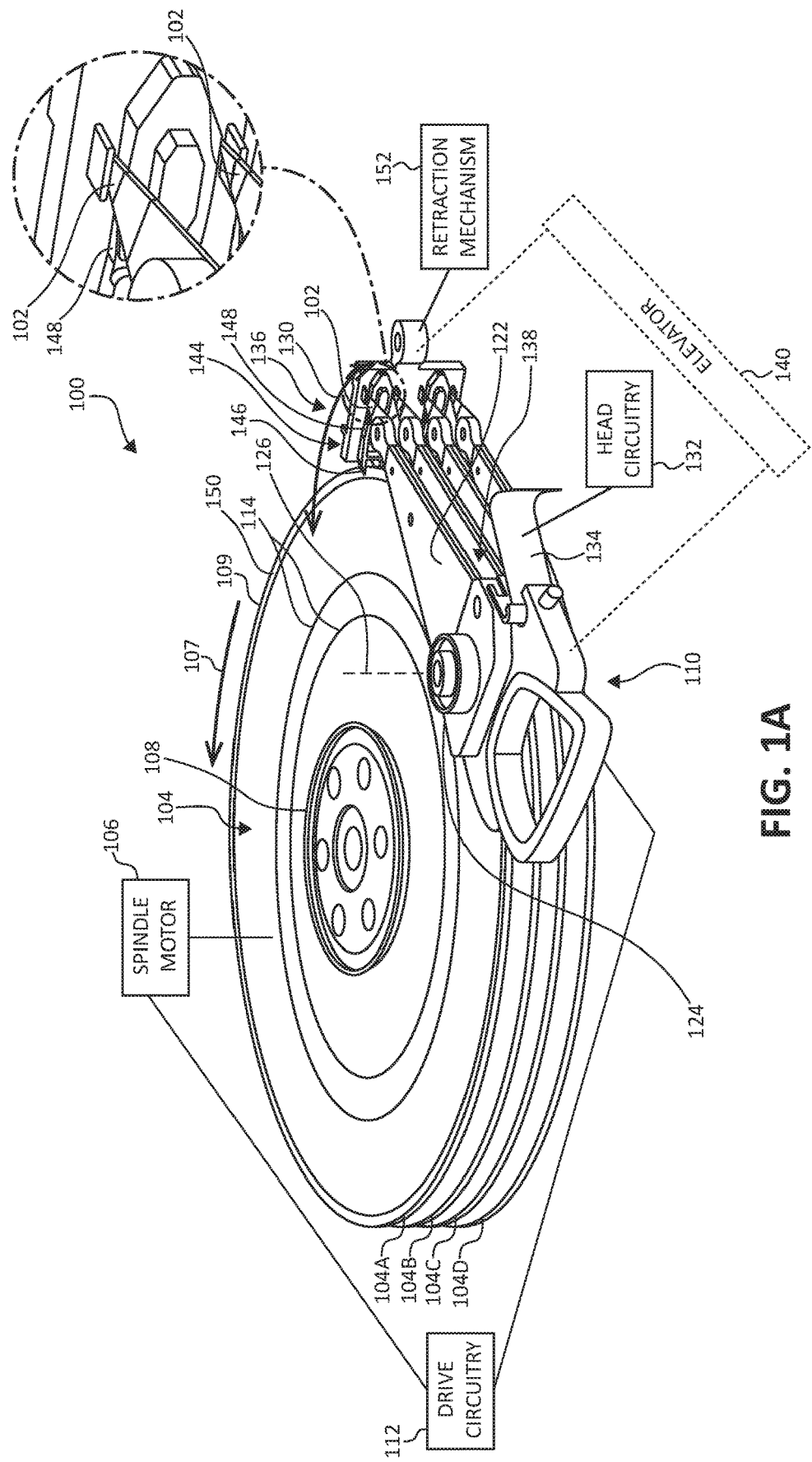
FIGS. 1A-1C are schematic illustrations of a data storage device including data storage media, heads for reading data from and/or writing data to the data storage media, and a retractable ramp for supporting the heads in accordance with one embodiment.

FIG. 1A shows an illustrative operating environment in which certain embodiments disclosed herein may be incorporated. The operating environment shown in FIG. 1A is for illustration purposes only. Embodiments of the present disclosure are not limited to any particular operating environment such as the operating environment shown in FIG. 1A. Embodiments of the present disclosure are illustratively practiced within any number of different types of operating environments.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that, when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

FIG. 1A is a schematic illustration of a data storage device 100 including data storage media, heads for reading data from and/or writing data to the data storage media and a retractable ramp for supporting the heads. In data storage device 100, heads 102 may be positioned over storage media 104 to read data from and/or write data to the data storage media 104. In the embodiment shown in FIG. 1A, the data storage media 104 are rotatable data storage discs, with each disc 104 having opposing surfaces that serve as data storage surfaces. It should be noted that, in some embodiments, a single disc may be employed instead of multiple discs. For read and write operations, a spindle motor 106 (illustrated schematically) rotates the media 104 as illustrated by arrow 107 and an actuator mechanism 110 positions the heads 102 relative to data tracks 114 on the rotating media 104 between an inner diameter (ID) 108 and an outer diameter (OD) 109. Both the spindle motor 106 and actuator mechanism 110 are connected to and operated through drive circuitry 112 (schematically shown). Each head 102 is coupled to the actuator mechanism 110 through a suspension assembly which includes a load beam 120 connected to an actuator arm 122 of the mechanism 110 for example through a swage connection. The actuator mechanism 110 is rotationally coupled to a frame or deck (not shown) through a bearing 124 to rotate about axis 126. Rotation of the actuator mechanism 110 moves the heads 102 in a cross-track direction as illustrated by arrow 130. Each of the heads 102 includes one or more transducer elements (not shown) coupled to head circuitry 132 through flex circuit 134.

As indicated above, in general, in order to keep read/write heads 102 from landing on discs 104 in a data storage device 100 when, for example, power is removed from the data storage device 100, and to prevent the heads 102 from colliding with outer edges of the discs 104 during load and unload operations, a head-support ramp 136 is provided adjacent to the OD 109 of the discs 104. As can be seen in FIG. 1A, ramp 136 includes tapers 144 that have edges 146 that are located over portions of the disc surfaces near the OD 109 to enable the heads 102 to easily move on/off the discs from/to main portions 148 of tapers 144 where lifts or lift tabs 149, which extend beyond heads 102, rest when the heads 102 are in a "parked" position.

When, for example, heads 102 are in the parked position and data storage device 100 receives a command from a host (not shown) to access one or more disc 104 surfaces, actuator mechanism 110 rotates about axis 126 to move the heads 102 toward the disc 104 surfaces. Such movement of the actuator mechanism 110 causes the lifts or lift tabs 149 to move towards the discs 104 by following surfaces of the tapers 144 towards the edges 146. When the heads 102 reach the edges 146, they establish bearings (e.g., air bearings) on the disc 104 surfaces and are then able to access the disc 104 surfaces for reading and/or writing to complete executing the command received from the host.

The process of moving the heads 102 from the ramp 136 to the disc 104 surfaces, which is referred to as a head load (or simply a load) operation, occurs smoothly when the edges 146 of the tapers 144 are located over portions of the disc surfaces near the OD 109. Similarly, the process of moving the heads 102 from the disc 104 surfaces to the ramp 136, which is referred to as a head unload (or simply an unload) operation, takes place smoothly when the when the edges 146 of the tapers 144 are located over portions of the disc surfaces near the OD 109. The heads 102 may be unloaded when, for example, the data storage device 100 no longer needs to access the disc 104 surfaces. Portions of the disc 104 surfaces over which the edges 146 of the tapers 144 are positioned during head load and unload operations are referred to as load/unload zones and are denoted by reference numeral 150 in FIG. 1A.

Figure 1B:
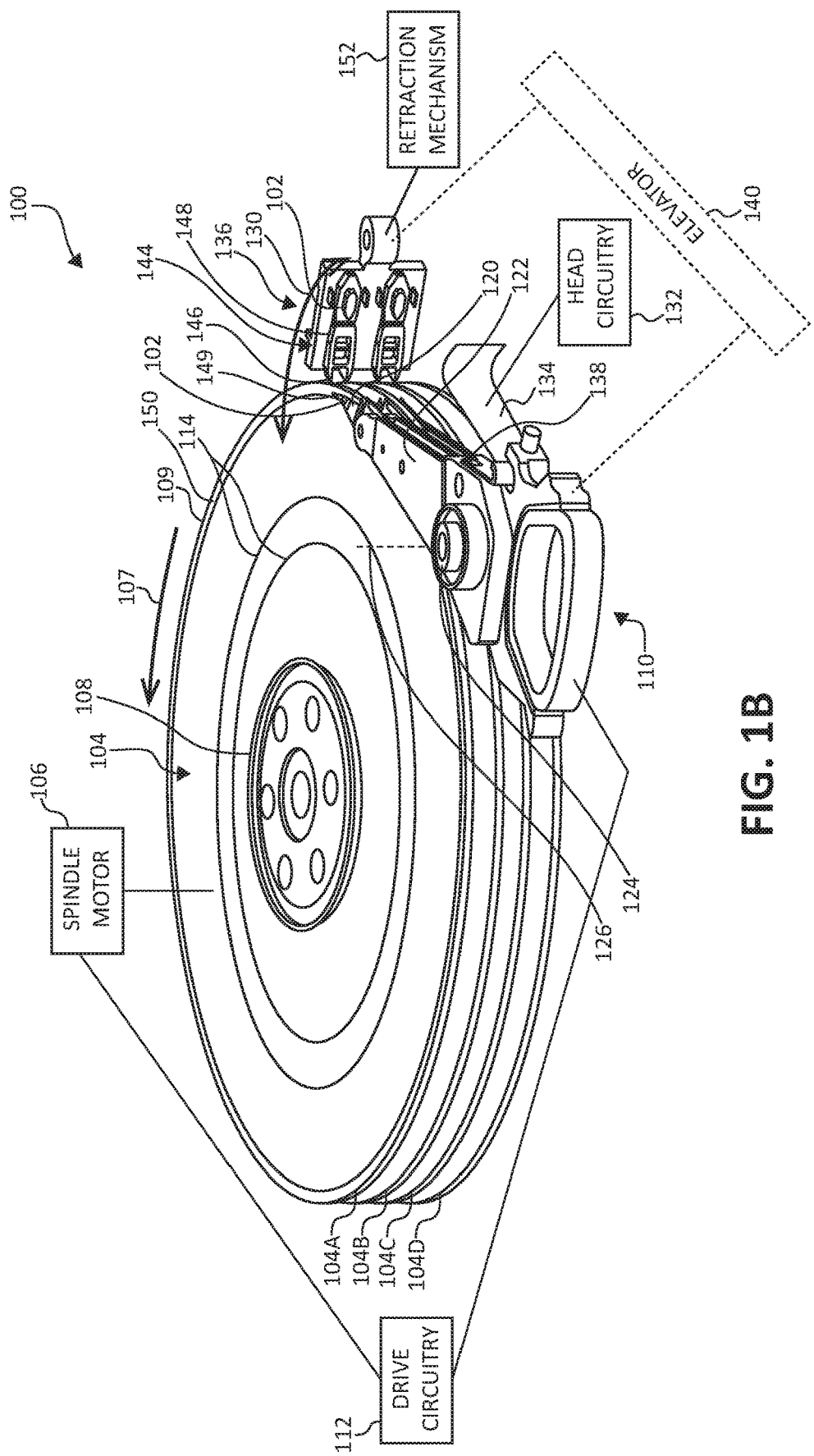

As indicated above, not recording data in the load/unload zones may amount to a loss of about 5% storage capacity of the data storage device 100. To avoid such a loss in capacity, data storage device 100 employs a retraction mechanism 152 that is attached to ramp 136 and is operable to retract ramp 136, such that edges 146 of tapers 144 are withdrawn from the OD 109 region to no longer substantially overlap the load/unload zones 144 after the heads 102 are properly loaded and supported by, for example, the air bearings, thereby making the load/unload zones 150 accessible for data storage/retrieval. FIG. 1B shows ramp 136 in a retracted position and the load/unload region being accessed by the heads 102. Details regarding example retraction mechanisms are provided further below.

In some embodiments, in addition to retracting ramp 136 to allow for recording data in load/unload zone 150 during operation of data storage as shown in FIG. 1B, ramp 136 may also be retracted when the heads 102 are in the parked position on ramp 136. The retraction of the ramp 136 when the heads 102 are in the parked position enables up and down movement of heads 102. Reasons why up and down movement of the heads 102 is used is some embodiments and a description of one such embodiment are provided below.

In some embodiments, a number of heads 102 is less than a number of disc 104 surfaces. For example, data storage device 100 of FIGS. 1A and 1B includes 4 discs, with a total of 8 data storage surfaces, and 4 heads 102. Each of the 4 heads 102 is coupled to the actuator mechanism 110 through a suspension assembly which includes load beam 120 connected to an actuator arm 122. The actuator mechanism 110, the load beams 120 and the actuator arms 122 with the heads 102 and lift tabs 149 are collectively referred to as a head stack assembly (HSA). The HSA, which is denoted by reference numeral 138, may be moved along axis 126 between an upper position and a lower position with the help of an elevator 140, which is schematically shown in FIG. 1A. In the upper position shown in FIGS. 1A and 1B, the 4 heads interact with data storage surfaces of discs 104A and 104B. In the lower position (not shown), the same 4 heads interact with data storage surfaces of discs 104C and 104D.

Figure 1C:
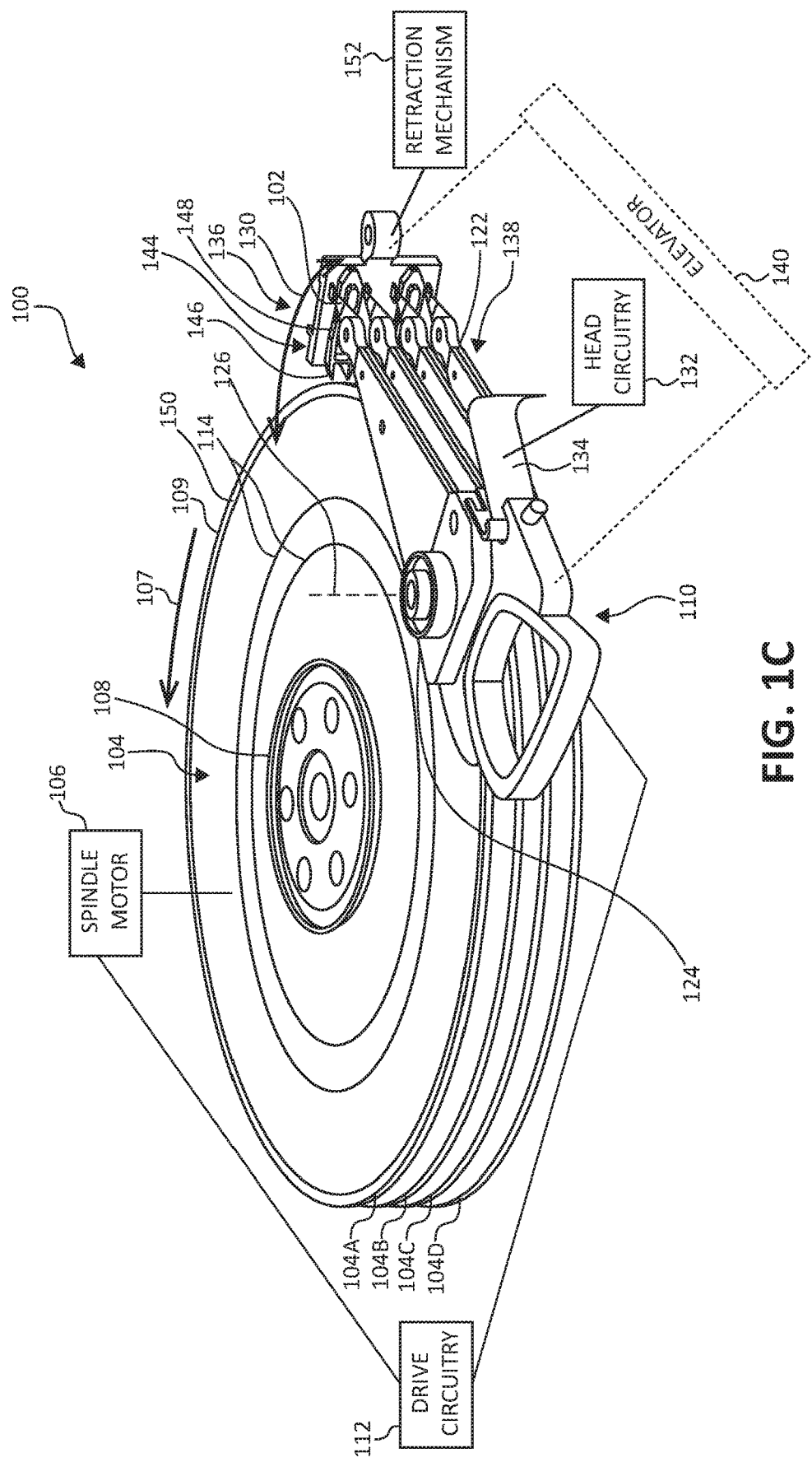

In order to enable the up/down movement of the HSA 138, head-support ramp 136 is designed to be retractable away from the OD 109 to permit the upward/downward movement of the ramp and HSA 138 without contacting the data storage media 104. In order to move the HSA 138 from either the upper position to the lower position or from the lower position to the upper position, the HSA 138 is first rotated about axis 126 until lift tabs 149 of the HSA 138 are supported on ramp 136 when the edges 146 of the tapers 144 are located over portions of the disc surfaces near the OD 109. Then, the ramp 136, with the lift tabs 149 of the HSA 138 thereon, is retracted away from the discs 104 by the retraction mechanism 152. Once the ramp 136 supporting the heads 102 is retraced as shown in FIG. 1C, the HSA 138 and the ramp 136 may be moved up/down in unison by the elevator 140. In the position shown in FIG. 1C, the HSA 138 and the ramp 136 may be moved down in unison for the heads 102 to be able to access data storage surfaces of discs 104C and 104D. Details regarding one embodiment of elevator 140 are provided below in connection with FIG. 2.

Figure 2:
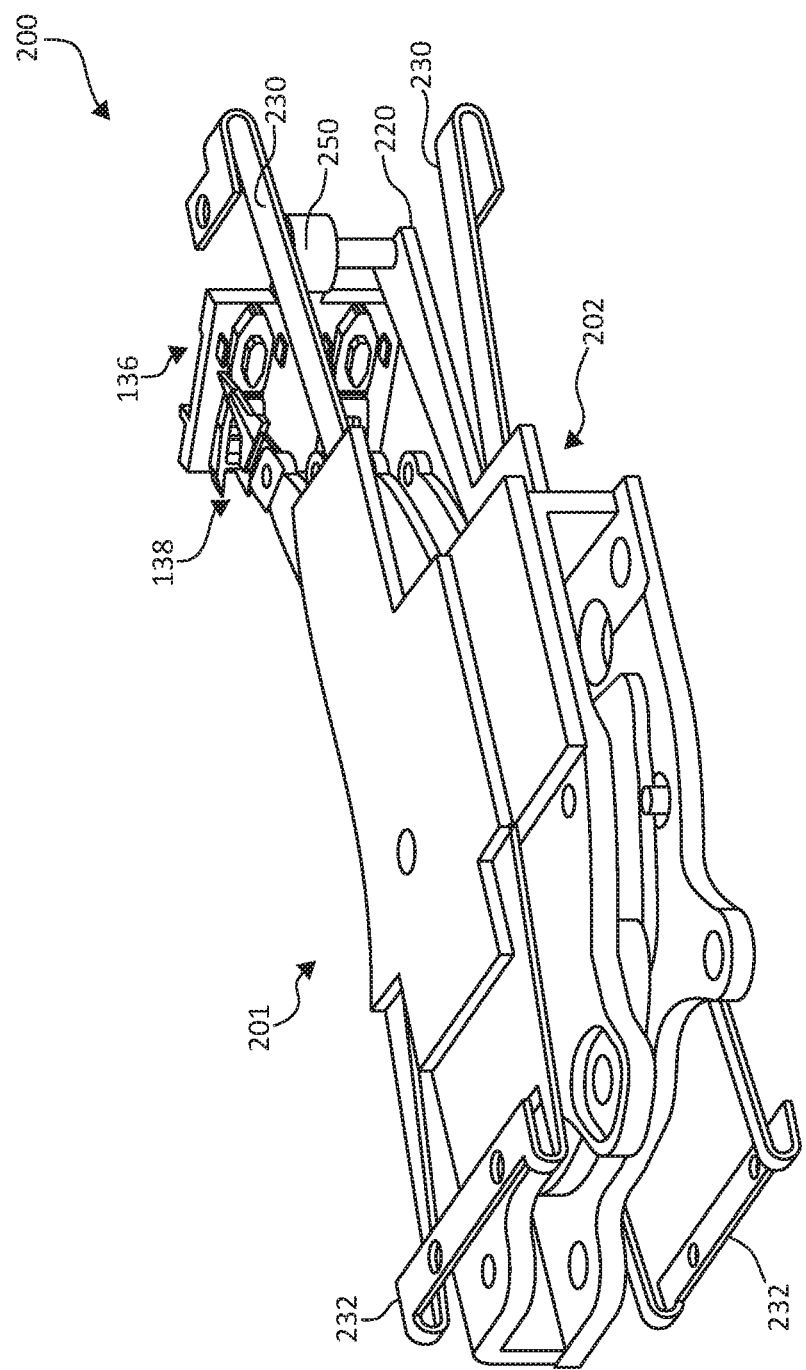
FIG. 2 is a perspective view of an embodiment of an elevator for simultaneously moving the retractable ramp and a head stack assembly included in the data storage device of FIGS. 1A-1C.

FIG. 2 illustrates an embodiment of an elevator 200 for the ramp 136 and the HSA 138, allowing them to move in unison. Elevator 200 includes an upper portion 201 and a lower portion 202. In one embodiment, each of portions 201 and 202 has a flexible first end 230 and a flexible second end 232. In general, one or both portions 201 and 202 may be either flexible or floating. The HSA 138 and ramp 136 are positioned between the upper portion 201 and the lower portion 202 and are connected together via a base 220 of elevator 200, thereby enabling the HSA 138 and the ramp 136 to be moved together. In one embodiment, the elevator base 220 may be driven up and down by a coil and a magnet (not shown) with hard stops at both ends that limit the extent of upward and downward movement of the HSA 138 and the ramp 136. In general, any suitable driving mechanism may be used to move elevator 200 up and down.

In the embodiment illustrated in FIG. 2, the upper limit comprises a stopper 250 arranged with the ramp 136. The flexible first end 230 of the upper portion 201 reaches the stopper 250 of the ramp 136 and halts the upward movement. In the downward direction, the movement may be stopped by the base 220 reaching the flexible first end 230 of the lower portion 202 which halts the progression of the downward movement. This arrangement may be pre-assembled before being placed into a form factor for a disc drive.

In some embodiments, when a number of heads 102 is less than a number of disc 104 surfaces, and the discs 104 are closely spaced, at least some of the discs 104 may be moved up/down by retractable ramp 136 to enable read/write operations to be carried out. Such an embodiment is shown in FIGS. 3A-3C, which are described below.

Figure 3A:
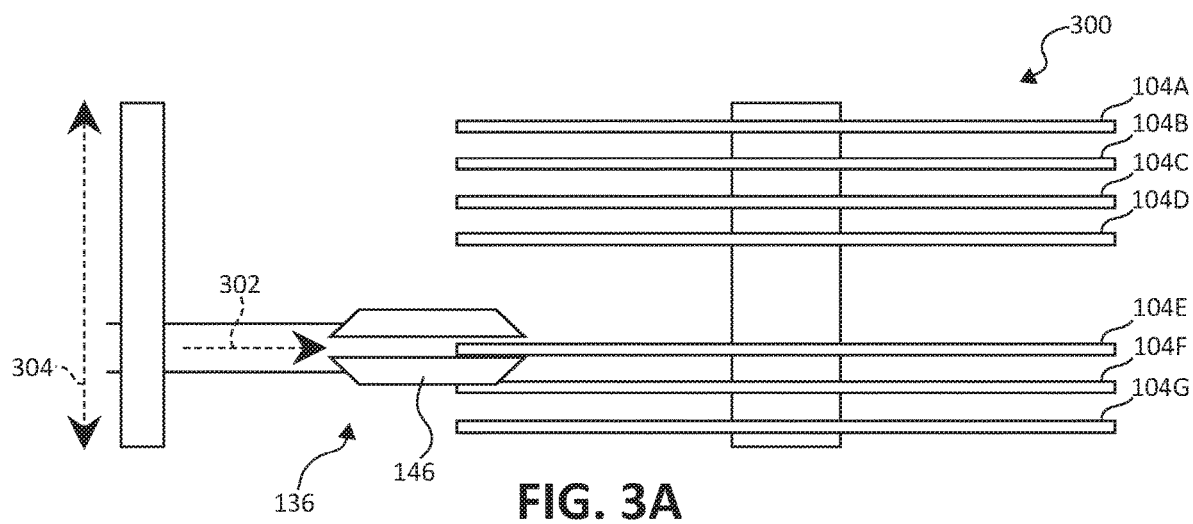
FIGS. 3A-3C are diagrammatic illustrations of portions of a data storage device including discs that are vertically movable by a retractable ramp in accordance with one embodiment.
Figure 3B:
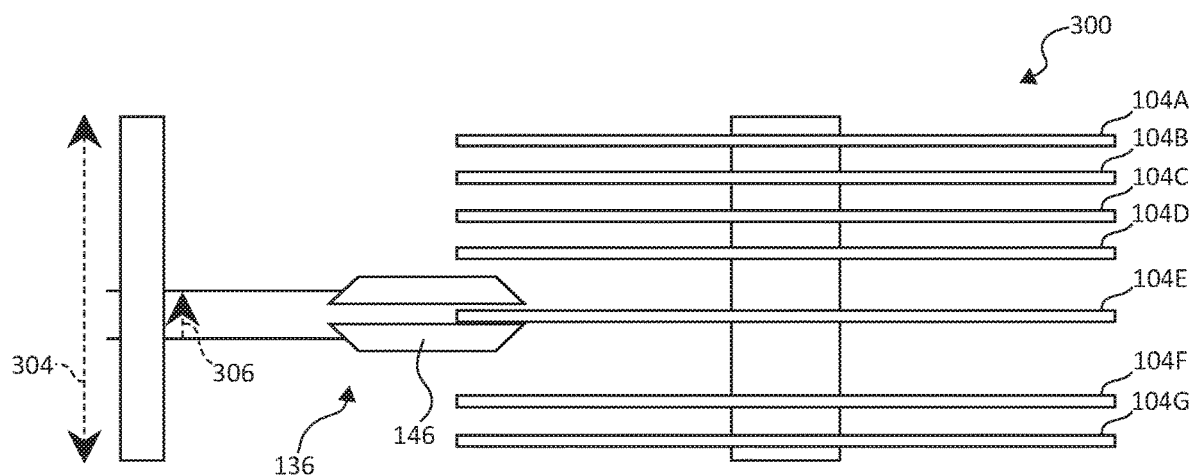
Figure 3C:
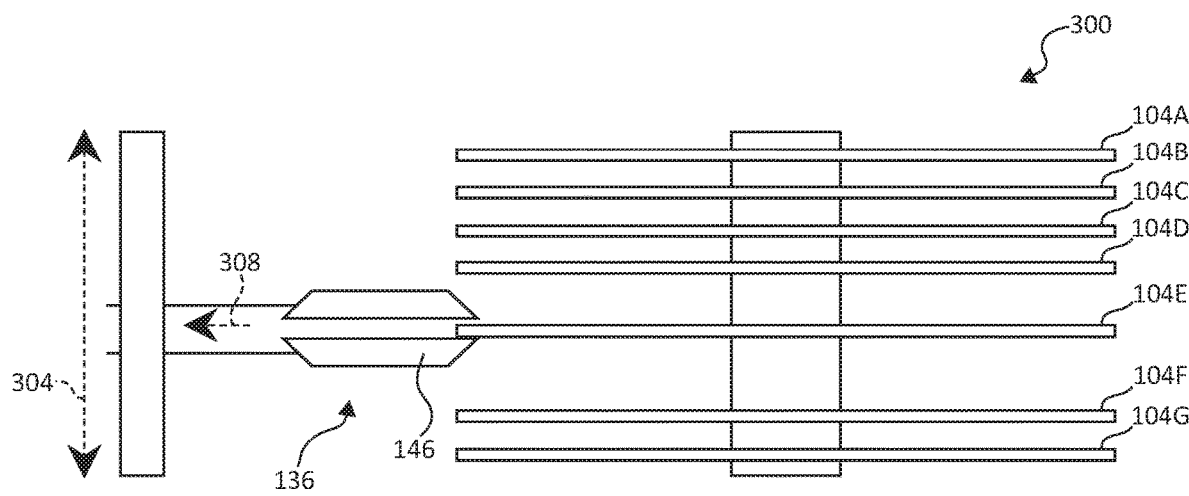

FIGS. 3A-3C illustrate an embodiment where a data storage device 300 may increase volumetric capacity (relative to a data storage device such as 100 of FIG. 1A) by allowing discs 104 to translate vertically, thereby permitting a decrease in relative disc spacing of at least some of the discs 104 to a distance that is small enough to be insufficient to accommodate an arm and head. In the embodiment of FIGS. 3A-3C, one up head (e.g., a head that interacts with upper surfaces of discs 104) and one down head (e.g., a head that interacts with lower surface of discs 104) may be employed to interact with discs 104A-104G. In the interest of simplification, the up and down heads are not shown in FIGS. 3A-3C. For example, in order to accommodate the down head to carry out a read/write operation to the lower surface of disc 104E, ramp 136 is first moved in a horizontal or X-direction as shown by arrow 302 in FIG. 3A. Once the edge 146 of ramp 136 reaches the position below disc 104E as shown in FIG. 1A, disc 104E may be moved in an upward direction along a Z-axis. Up/down movement along the Z-axis is denoted by reference numeral 304, and the extent of upward movement by disc 104E is denoted by reference numeral 306. The upward movement may be carried out by, for example, elevator 140 shown in FIG. 1A, which may lift the ramp 136, which, in turn, lifts disc 104E. Once disc 104E is moved to the position shown in FIG. 3B, the down head may be accommodated for a read/write operation to the lower surface of disc 104E. After the down head is loaded, the ramp 136 may be retracted to the position shown in FIG. 3C (in direction 308) for the down head to be able to read/write from/to load/unload zone as described above in connection with FIG. 1A.

Figure 4A:
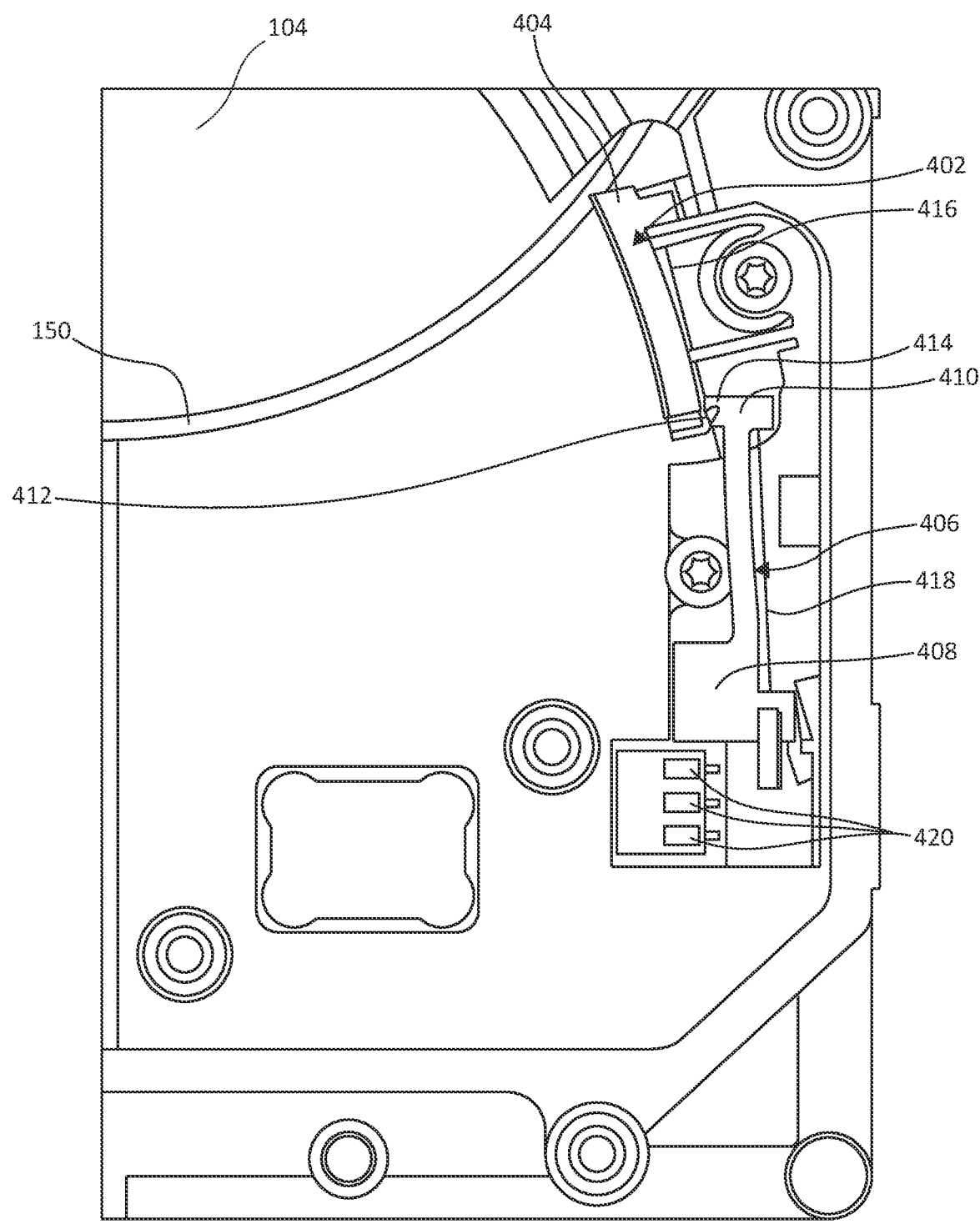
FIGS. 4A-4C are diagrammatic illustrations of portions of a data storage device that employs a ramp retraction mechanism including one or more shape memory alloy (SMA) wires in accordance with one embodiment.
Figure 4B:
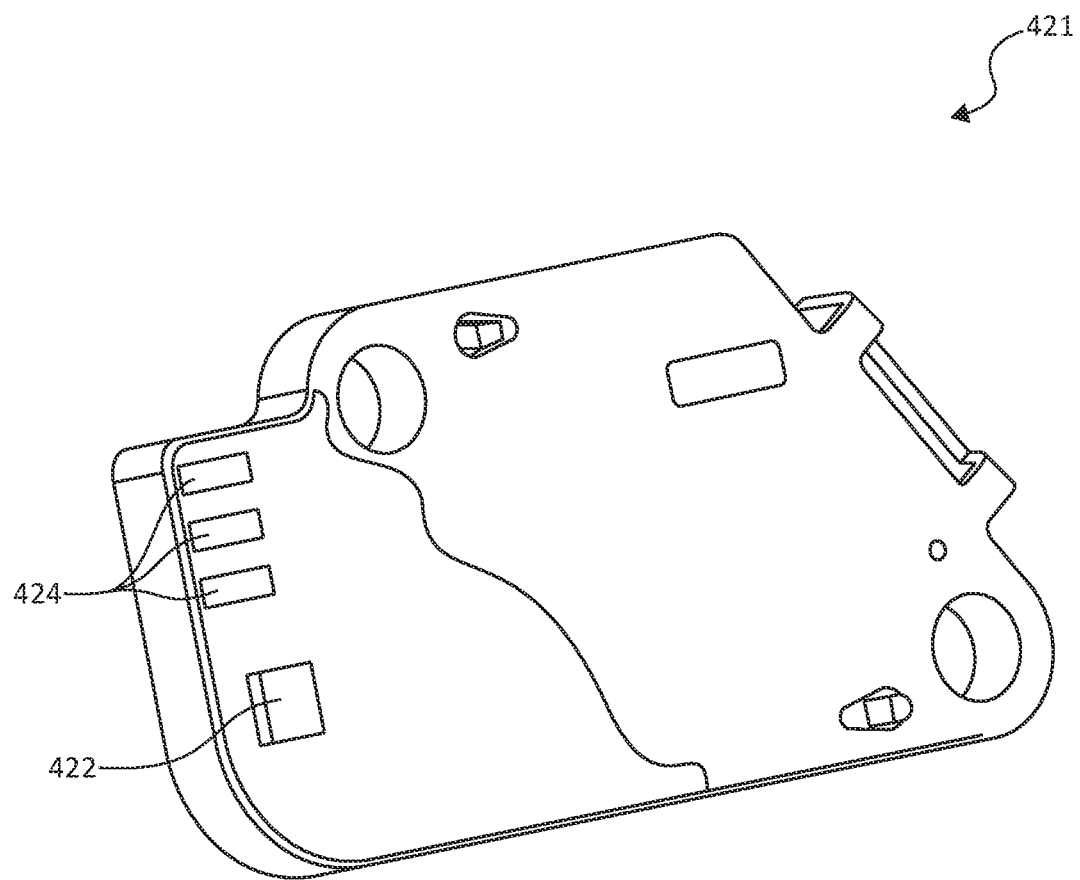
Figure 4C:
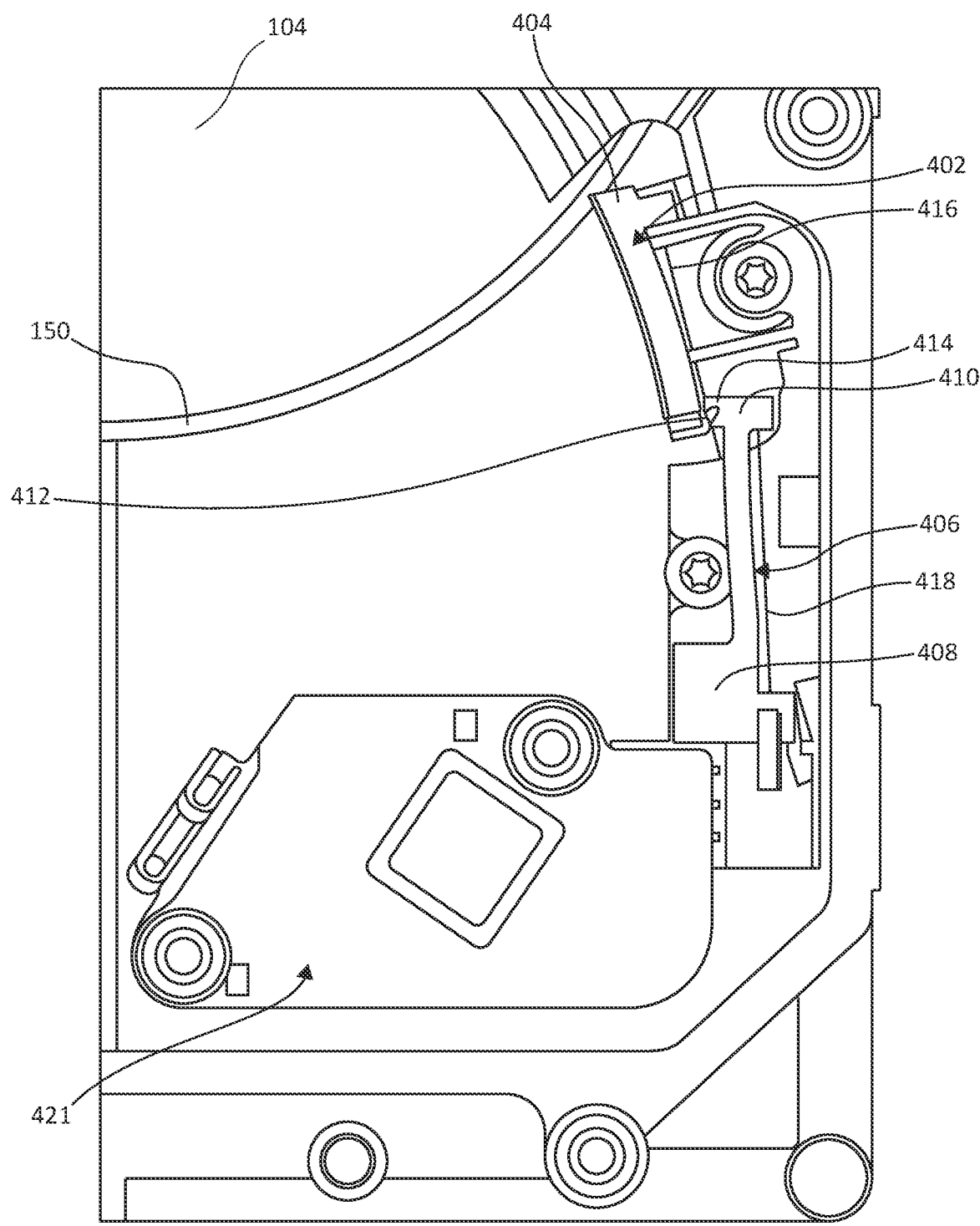

FIGS. 4A-4C are diagrammatic illustrations of portions of a data storage device 400 that employs a retractable ramp in accordance with one embodiment. FIG. 4A is a top view of a portion of data storage device 400 without a ramp retraction control module of FIG. 4B installed, and FIG. 4C is a top view of the portion of the data storage device 400 with the ramp retraction control module of FIG. 4B installed.

Referring to FIG. 4A, ramp 402 is shown in a retracted position where an edge 404 of the ramp 402 is only over a small portion of load/unload zone 150. It should be noted that, in embodiments in which the ramp 402 is moved up/down in addition to being retractable, the edge 404 of ramp 402 is withdrawn past OD 109 to prevent the ramp 402 from contacting (or colliding with) the disc 104 during the up/down motion. As can be seen in FIG. 4A, the ramp 402 is held in the retracted position by latch 406. Latch 406 has a fixed end 408, which may be attached to any suitable portion of the data storage device 400, and a moveable end 410 that has a protrusion 412 that is configured to engage a corresponding protrusion 414 of the ramp 402 when the ramp 402 is retracted.

In the embodiment shown in FIG. 4A, shape memory alloy (SMA) wires are employed to carry out the ramp 402 retraction. In general, a SMA wire may be in an expanded state at room temperature (e.g., between about 15 degrees Celsius (° C.) and about 25° C.), To cause the SMA wire to contract, an electrical current may be supplied to the SMA wire to heat the wire. The heating of the wire above room temperature causes the wire to contract. It should be noted that SMA wires are only one example of a retraction/manipulation mechanism and other suitable retraction/manipulation mechanisms may be used in other embodiments. As can be seen in FIG. 4A, a first end of a first SMA wire (or wires) 416 is connected to ramp 402, and a first end of a second SMA wire (or wires) 418 is connected to latch mechanism 406 at moveable end 410. More particularly, the first end of the second SMA wire 418 is connected to an outer portion of the moveable end 410 of the latch mechanism 406, with the protrusion 414 being on the opposite (or inner) side of moveable end 410. Second ends of SMA wires 416 and 418 are connected to pins 420, with one of the pins 420 serving as a common (or ground) connection pin. Portions of the SMA wires 416 and 418 proximate to the pins 420 are hidden in FIG. 4A.

Referring to FIG. 4B, a ramp retraction control module 421 is shown. The ramp retraction control module 421 includes a control chip 422 and pads 424 that are coupled to the control chip 422. The coupling between the control chip 422 and the pads 424 is hidden in FIG. 4B. Control chip 422 is configured to selectively provide power (e.g., current) to SMA wires 416 and 418 when the ramp retraction control module 421 is installed in data storage device 400 in a manner shown in FIG. 4C. Here, the pads 424 are in contact with the pins 420.

To move the ramp 402 to the retracted position shown in FIGS. 4A and 4B, control chip 422 supplies power (e.g., current) to SMA wire 416, which responsively contracts as a result of a temperature rise caused by the current. The contraction of SMA wire 416 causes ramp 402 to retract. Withdrawal of the ramp 402 takes place until protrusion 412 on ramp 402 engages with corresponding protrusion 414 on latch 406. In order to facilitate the engagement of 412 and 414, control chip 422 may supply power (e.g., current) to SMA wire 418 substantially concurrently with current being supplied to SMA wire 416. This causes SMA wire 418 to contract, which, in turn, causes the latch 406 to bend backwards near end 410. The backward bending of the latch 406 brings protrusion 414 to a position where it is capable of engaging with protrusion 412 when latch 406 straightens from its bent position. Thus, with latch 406 in the retracted position, current supply to SMA wire 418 is terminated, which causes SMA wire 418 to expand. Expansion of the SMA wire 418 cause latch 406 to straighten, which, in turn, causes protrusion 414 to engage protrusion 412. When protrusions 412 and 414 are engaged, supply of current to SMA wire 416 may be terminated by the control chip 422 because ramp 416 is now held in the retraced position by latch 406.

To carry out a "quick release" of the ramp 402 from the retracted position to its non-retraced position (not shown in FIGS. 4A-4C), control chip 422 provides power (e.g., current) to SMA wire 418, which responsively contracts. The contraction of SMA wire 418 causes the latch 406 to bend backwards, which, in turn, results in protrusion 414 disengaging from protrusion 412, thereby causing ramp 402 to return back to its non-retracted position. The quick release may be carried out when an emergency condition occurs (e.g., a loss of main power supply) in the data storage device 400. The quick release may be carried out using backup or residual power in the data storage device 400. A normal release of the ramp 402 by the latch 406 may be carried out during normal operation of data storage device 400 under normal power supply conditions. Both normal and quick release operations are described below in connection with FIGS. 5A and 5B.

Figure 5A:
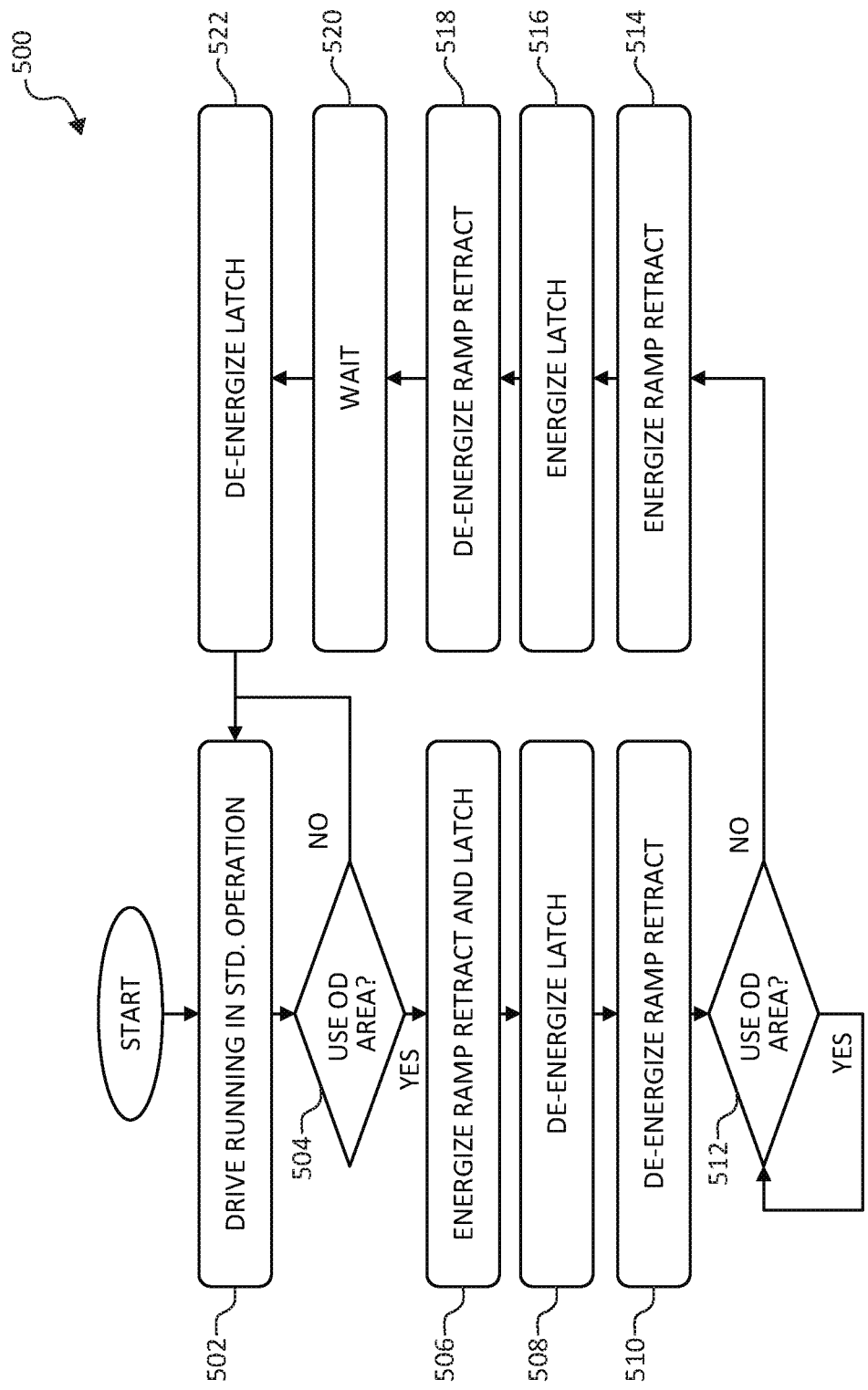
FIGS. 5A and 5B and flowcharts of methods of operating a retractable ramp and a latch mechanism in different data storage device operating modes.
Figure 5B:
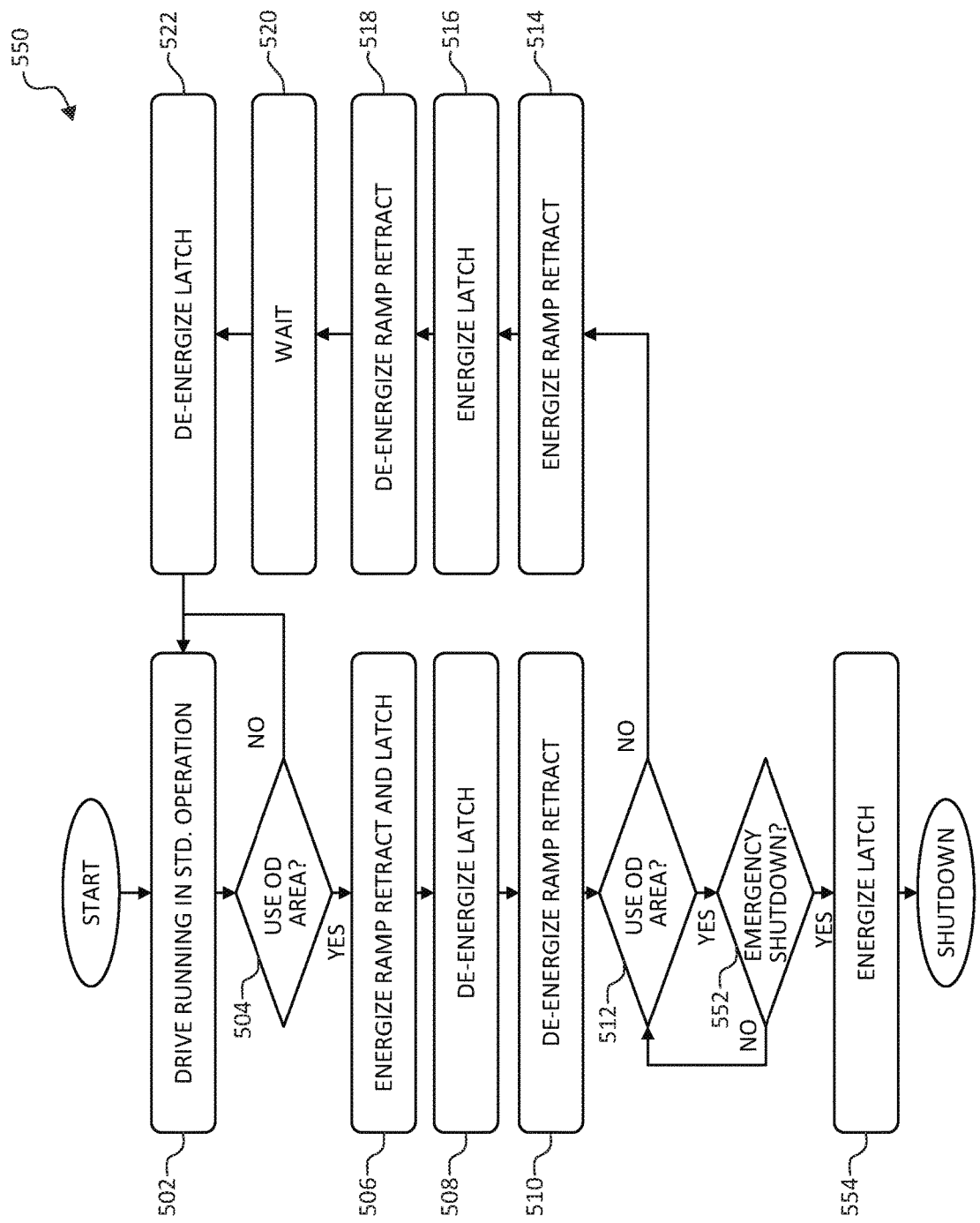

FIGS. 5A and 5B and flowcharts of methods of operating a retractable ramp and a latch mechanism in different data storage device operating modes. FIG. 5A is a flowchart of a basic retraction and latching method 500 when the data storage device is operating in a normal or standard mode. The normal or standard operation mode is denoted by reference numeral 502. At 504, a determination is made as to whether read/write operations are to be carried out in a load/unload zone of the data storage device. If no such operations are to be carried out, control returns to 502. If read/operations are to be carried out in the load/unload zone, control passes to 506. At 506, power is provided to the retraction mechanism coupled to the ramp and to the latch (e.g., the retraction mechanism is energized). As described above in connection with FIGS. 4A-4C, when power is supplied to the retraction mechanism coupled to the ramp (e.g., the SMA wire), the SMA wire contracts, thereby move the ramp to its retraced position. Supplying power to the SMA wire coupled to the latch causes the latch to bend backwards. Thus, the operations carried out at 506 cause the ramp to retract and the latch to bend backwards substantially simultaneously. At 508, power to the latching mechanism is terminated (e.g., the SMA coupled to the latch no longer receives power or is de-energized). This results in the latch engaging the ramp, thereby causing the ramp to be held in the retracted position independently of whether power is provided to the SMA wire connected to the ramp. Thus, power to the SMA wire connected to the ramp is terminated at 510.

At 512, use of the load/unload zone for the read/write operations is monitored. Once it determined that load/unload zone is no longer to be used, control passes to 514. At 514, power is provided to the ramp retraction mechanism (e.g., power is provided to the SMA wire connected to the ramp). Thereafter, at 516, power is provided to the latch mechanism (e.g., power is provided to the SMA coupled to the latch). This causes the latch to disengage from the ramp. At 518, power to the ramp retraction mechanism is terminated (e.g., the power provided to the SMA wire connected to the ramp is terminated). This causes the SMA wire connected to the ramp to expand, thereby returning the ramp to its non-retracted position. After a predetermined wait period shown at 520, the power to the latching mechanism is terminated (e.g., power is provided to the SMA coupled to the latch is terminated) at 522, thereby returning the latch to the non-bent position.

FIG. 5B is flowchart of a method 550 that adds emergency data storage device shutdown-related operations to method 500 of FIG. 5A. In the interest of brevity, a description of 502-522 is not repeated in connection with FIG. 5B. In method 550, in addition to monitoring the use of the load/unload zone for the read/write operations at 512 when the ramp is in a retracted position, at 552, monitoring is carried out for abnormal events taking place in the data storage device that may cause an emergency shutdown. Upon detection of an emergency shutdown (e.g., from a signal sent by a drive controller (not shown) to ramp retraction control module 421) at 552, control passes to 554 where power is provided to the latch mechanism (e.g., power is provided to the SMA wire coupled to the latch). This results in a "quick release" of the ramp, thereby causing a rapid return of the ramp to its un-retracted position for the heads to be loaded onto the ramp. Once the heads are loaded onto the ramp, the data storage device may be safely shut down.

Figure 6:
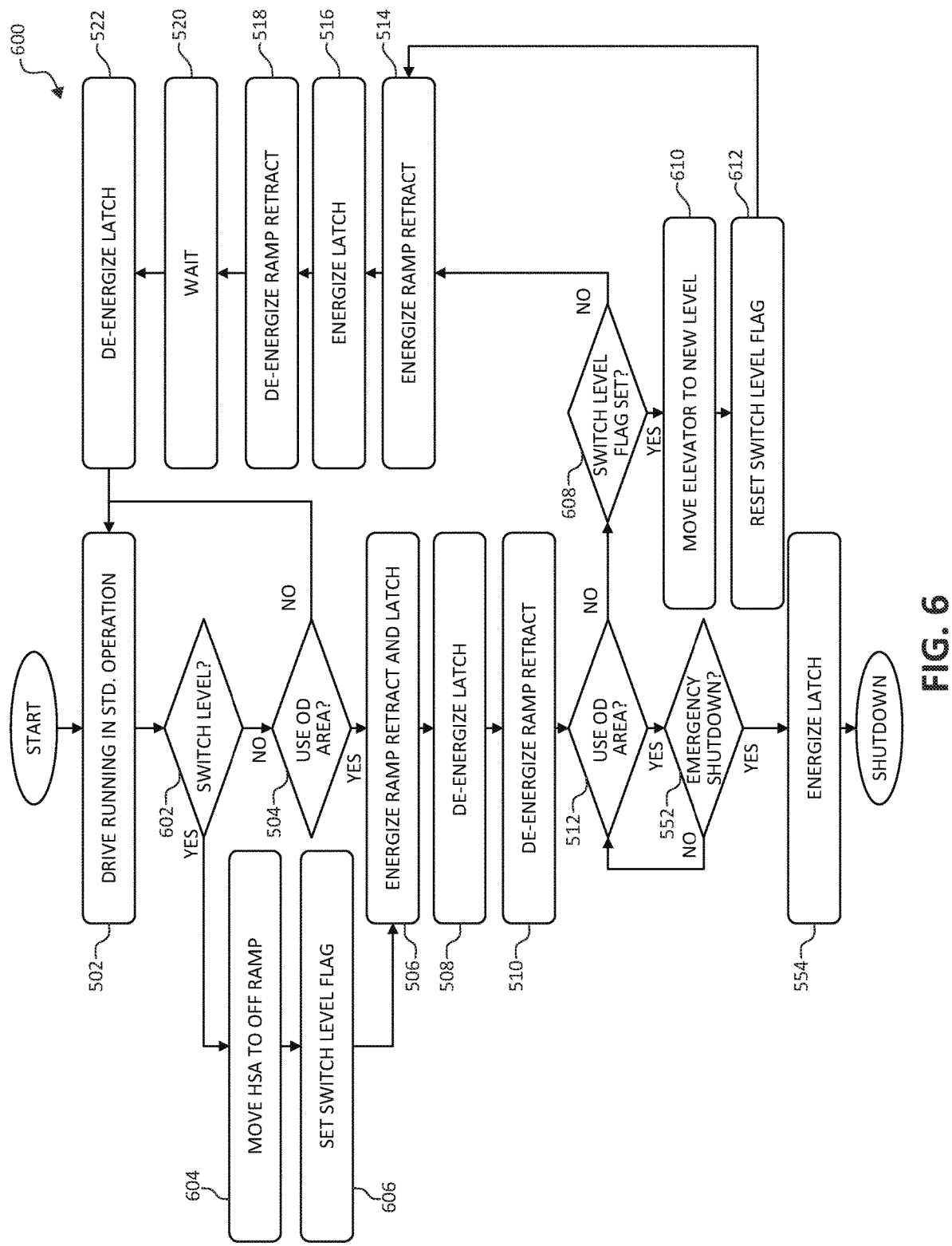
FIG. 6 is a flowchart of a method that may be carried out in a data storage device that includes a retractable ramp and an elevator for moving the ramp.

FIG. 6 is a flowchart of a method 600 that may be carried out in a data storage device that includes a retractable ramp and an elevator for moving the ramp along a z-axis direction. In the interest of brevity, a description of 502-522, 552 and 554 is not repeated. At 602, a determination is made as to whether read/write operations are to be carried out at a different level (e.g., on one or more disc surfaces that may not be accessed without moving the head(s) in a z-direction to reach the surface(s) of interest). If it is determined, at 602, that a level switch is to be carried out, the HSA is moved to the ramp at 604. Thereafter, at 606, a flag is set in a suitable memory within the data storage device to indicate that the HSA is to be moved to a different level. Thereafter, the ramp is retracted and latched in accordance with 506-510 described earlier in connection with FIG. 5A. At 512, use of the load/unload zone for the read/write operations is monitored. When it is determined, at 512, that load/unload zone is no longer to be used, control passes to 608. At 608, a determination is made as to whether the switch level flag is set. If the switch level flag is found to be set, control passes to 610 where the elevator is operated to move the HAS and the ramp to the new level. The switch level flag is then reset at 612.

It should be noted that the method embodiments described above may be carried out by drive circuitry 112, head circuitry 132, ramp 136, latch mechanism 406, retraction mechanism 152 (e.g., ramp retraction control module 421), elevator 140, etc. Portions of drive circuitry 112, head circuitry 132 and ramp retraction control module 421 may together constitute a controller that carries out at least some control operations in the method embodiments described above.

In the above-described embodiments, the retraction mechanism employs a SMA wire the contracts when it is energized. The SMA wire is only one example of an element that may be used to carry out the retraction of the ramp. In general, any retraction mechanism that moves the ramp between non-retracted and retracted positions by expansion and/or contraction may be employed. The expansion and/or contraction may act in a manner similar to a muscle that can change length by contracting and/or stretching. Thus, the ramp retraction mechanism may also be viewed as a muscle-based system. In general, any suitable expansion/contraction system may be employed in different embodiments. For example, some alternate embodiments may employ piezo-electric elements to enable the retraction of the ramp.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
a ramp configured to support at least one head in the data storage device;
a retraction mechanism coupled to the ramp and configured to move the ramp from a non-retracted position to a retracted position by at least one of expansion or contraction of at least a portion of the retraction mechanism; and
a ramp retraction control module operably coupled to the retraction mechanism, the ramp retraction control module configured to provide the retraction mechanism with a first control signal that causes the retraction mechanism to move the ramp from the non-retracted position to the retracted position,
wherein the retraction mechanism comprises a first shape memory alloy (SMA) wire.

2. The data storage device of claim 1 and further comprising:
a latch configured to hold the ramp in the retracted position;
a latch manipulation mechanism coupled to the latch; and
the ramp retraction control module further configured to provide the latch manipulation mechanism with second control signals that cause the latch to engage the ramp in the retracted position, thereby holding the ramp in the retracted position, and cause the latch to release the ramp from being held in the retracted position.

3. The data storage device of claim 2 and wherein the ramp retraction control module is configured to operate the retraction mechanism and the latch manipulation mechanism to provide multiple ramp release speeds, and wherein the multiple ramp release speeds comprise a normal ramp release provided during normal operation of the data storage device and a quick ramp release provided during an emergency shutdown of the data storage device.

4. The data storage device of claim 1 and further comprising a latch configured to hold the ramp.

5. The data storage device of claim 2 and wherein the first control signal comprises electrical power that energizes the first SMA wire.

6. The data storage device of claim 2 and wherein the latch manipulation mechanism comprises a second SMA wire.

7. The data storage device of claim 6 and wherein the second control signals comprise electrical power that energizes the second SMA wire during the latch engagement and during the latch release.

8. The data storage device of claim 2 and wherein the latch is formed of a flexible material, wherein the latch comprise a first end that is coupled to a base of the data storage device and a second end that is configured to be bent to carry out latch engagement and latch release operations.

9. The data storage device of claim 1 and further comprising:
the at least one head;
an actuator arm that supports the at least one head;
a plurality of data storage media with which the at least one head is configured to interact, and
wherein the ramp is further configured to move in at least one of an upward direction or a downward direction.

10. The data storage device of claim 9 and further comprising an elevator configured to move the actuator arm and the ramp with the head supported thereon in unison in the at least one of the upward direction or the downward direction.

11. The data storage device of claim 9 and further comprising an elevator configured to move individual ones of the plurality of data storage media by moving the ramp when a portion of the ramp is positioned adjacent to, and in contact with, the individual data storage medium.

12. A method of operating a ramp that is configured to support a head in a data storage device, the method comprising:
moving, by a ramp retraction control module, the ramp from a non-retracted position to a retracted position; and
selectively releasing, by the ramp retraction control module, the ramp from the retracted position at different speeds corresponding to different operating conditions in the data storage device.

13. The method of claim 12 and wherein the different speeds for releasing the ramp from the retracted position comprise a normal ramp release provided during normal operation of the data storage device and a quick ramp release provided during an emergency shutdown of the data storage device.

14. The method of claim 12 and wherein the moving of the ramp from the non-retracted position to the retracted position comprises energizing a first shape memory alloy (SMA) wire coupled to the ramp.

15. The method of claim 12 and wherein releasing the ramp from the retracted position comprises energizing a second SMA wire attached to a latch that holds the ramp in the retracted position.

16. The method of claim 12 and further comprising moving the ramp in at least one of an upward direction or a downward direction.

17. A data storage system comprising:
a ramp configured to support at least one head in the data storage system, the ramp having a non-retracted position and a retracted position in the data storage system; and
a ramp retraction control module coupled to the ramp and configured to selectively release the ramp from the retracted position at different speeds corresponding to different operating conditions in the data storage system.

18. The data storage system of claim 17 and wherein the different speeds for releasing the ramp from the retracted position comprise a normal ramp release provided during normal operation of the data storage system and a quick ramp release provided during an emergency shutdown of the data storage system.

19. The data storage system of claim 17 and further comprising a latch configured to hold the ramp in the retracted position, wherein the ramp retraction control module is configured to selectively release the ramp from the retracted position at the different speeds by selectively providing power to shape memory alloy (SMA) wires coupled to the ramp, the latch and the ramp retraction control module.

20. The data storage system of claim 17 and further comprising an elevator configured to move the ramp in at least one of an upward direction or a downward direction.

21. A data storage device comprising:
a ramp configured to support at least one head in the data storage device;
a retraction mechanism coupled to the ramp and configured to move the ramp from a non-retracted position to a retracted position by at least one of expansion or contraction of at least a portion of the retraction mechanism;
a ramp retraction control module operably coupled to the retraction mechanism, the ramp retraction control module configured to provide the retraction mechanism with a first control signal that causes the retraction mechanism to move the ramp from the non-retracted position to the retracted position;
a latch configured to hold the ramp in the retracted position;
a latch manipulation mechanism coupled to the latch; and
the ramp retraction control module further configured to provide the latch manipulation mechanism with second control signals that cause the latch to engage the ramp in the retracted position, thereby holding the ramp in the retracted position, and cause the latch to release the ramp from being held in the retracted position.

* * * * *